United States Patent [19]
Leavy et al.

[11] Patent Number: 5,928,311
[45] Date of Patent: Jul. 27, 1999

[54] METHOD AND APPARATUS FOR CONSTRUCTING A DIGITAL FILTER

[75] Inventors: Mark Leavy, Beaverton; Albert Shen, Hillsboro, both of Oreg.

[73] Assignee: Intel Corporation, Santa Clara, Calif.

[21] Appl. No.: 08/710,270

[22] Filed: Sep. 13, 1996

[51] Int. Cl.$^6$ .................................................. G06F 17/10
[52] U.S. Cl. ........................... 708/300; 708/303; 381/97
[58] Field of Search ..................... 364/724.011, 724.013, 364/724.12, 724.18; 381/17, 18, 92, 97

[56] References Cited

U.S. PATENT DOCUMENTS

| | | | |
|---|---|---|---|
| 3,982,070 | 9/1976 | Flanagan | 704/265 |
| 4,263,670 | 4/1981 | Sherman | 375/223 |
| 4,974,598 | 12/1990 | John | 600/509 |
| 5,363,186 | 11/1994 | Cohn et al. | 356/4.01 |
| 5,545,993 | 8/1996 | Taguchi et al. | 324/309 |

OTHER PUBLICATIONS

Kistler, Doris J., "A model of head–related transfer functions based on principal components analysis and minimum–phase reconstruction," *J. Acoust. Soc. Am.*, 91(3), pp. 1637–1647 (Mar. 1992).

Martens, William L., "Principal Components Analysis and Resynthesis of Spectral Cues to Perceived Direction," *Proceedings of the 1987 International Computer Music Conference*, (1987).

Kendall, Gary S. et al., "A Spatial Sound Processor For Loudspeaker and Headphone Reproduction," *AES 8th International Conference*, pp. 209–221.

Hayes et al; Signal Reconstruction from Phase or Magnitude; IEEE Transactions on Acoustics, Speech, and Signal Processing, vol. ASSP–28, No. 6, pp. 672–680, Dec. 1980.

Chu; Phase Digitizing Sharpens Timing Measurements; IEEE Spectrum; pp. 28–32, Jul. 1988.

Wightman et al; Headphone Simulation of Free–Field Listening. I: Stimulus Synthesis; Journal of the Acoustical Society of America; pp. 858–867, Feb. 1989.

Wightman et al; Headphone Simulation of Free–Field Listening. II: Psychophysical Validation; Journal of the Acoustical Society of America; pp. 868–878, Feb. 1989.

*Primary Examiner*—Emmanuel L. Moise
*Attorney, Agent, or Firm*—Blakely, Sokoloff, Taylor & Zafman

[57] ABSTRACT

A method and apparatus for constructing a digital filter from a set of data is described. The method comprises the following steps. A plurality of magnitude components of the set of data is encoded. A plurality of phase components of the set of data is encoded. The plurality of encoded magnitude components and encoded phase components are stored in a memory. The digital filter is constructed using the encoded magnitude components and encoded phase components from the memory.

48 Claims, 7 Drawing Sheets

METHOD AND APPARATUS FOR CONSTRUCTING A DIGITAL FILTER

BACKGROUND OF THE INVENTION

1. Field of the Invention

The present invention relates to digital filters. More specifically, the invention relates to a method and apparatus for modeling and synthesizing the phase component in digital filters.

2. Description of Related Art

Digital filters are used to model audio and video signals. Digital signals represented in the frequency domain as complex numbers have a phase component and a magnitude component. For instance, transfer functions describing the effect of sound travelling through space may be represented by a set of complex values that contains magnitude components and phase components. The magnitude and phase components of an audio transfer function are measured and stored in a memory. Typically, a digital filter accesses the phase component and magnitude component of a sound source from memory in order to resynthesize or model a particular sound effect.

Several techniques were used to reduce the amount of space required to store the phase component and magnitude component data. One technique reduced the magnitude components using an algorithm, such as principal component analysis (PCA) before storing the components in memory. The phase components of the digital signals were discarded and not stored in memory.

When reconstructing the digital filter, a phase component from a model was substituted for the original phase component. Two models used for modeling phase components were the linear phase model and the minimum phase model. According to the linear phase model, the phase increases linearly as the frequency increases. Under the minimum phase model, the phases are calculated in the time domain so that the filter is as short as possible. One advantage of the minimum phase model is that the filter is shorter and thus easier to compute.

Both the linear phase and minimum phase models operated on the erroneous assumption that eliminating the authentic phase component of a filter did not affect the sound quality of an audio signal. This assumption is not supported by the following facts. There is a delay between the time a sound signal enters a filter and the time the transformed sound signal leaves the filter. This delay varies with the frequency of the sound signal. But when one restores the information stored in the phase component using the linear or the minimum phase models, the frequency-dependent-delay information is lost. Thus, one of the drawbacks of using the linear or minimum phase models is the loss of the absolute time delay of the filter.

In particular, when using matched sets of filters, such as those used to represent head-related transforms, one loses the frequency-dependent Interaural Time Delay (ITD). This causes a decrease in the sound quality obtained from the filters. In order to restore the original sound quality to the filters, one must independently restore the ITD. Thus, removing or modeling the phase component achieves a sound quality inferior to using the original phase component to construct the digital filter.

SUMMARY

A method for constructing a digital filter from a set of data is disclosed. A plurality of magnitude components of the set of data is encoded. A plurality of phase components of the set of data is encoded. The plurality of encoded magnitude components and encoded phase components are stored in a memory. The digital filter is constructed using the encoded magnitude components and encoded phase components from the memory.

A digital filter is also disclosed. The digital filter comprises a magnitude encoding unit. The magnitude encoding unit encodes a plurality of magnitude components of a set of data. A phase encoding unit is coupled to the magnitude encoding unit. The phase encoding unit encodes a plurality of phase components of the set of data. A memory is coupled to the magnitude encoding unit and the phase encoding unit. The memory stores the encoded magnitude components and encoded phase components. A filter generation unit is coupled to the memory. The filter generation unit constructs the digital filter using the encoded magnitude components and the encoded phase components from memory.

BRIEF DESCRIPTION OF THE DRAWINGS

The present invention is illustrated by way of example and not a limitation in the figures of the accompanying drawings in which like references indicate similar elements.

FIG. 5b illustrates a second basis vector for the phase component of FIG. 5a.

FIG. 5c illustrates a third basis vector for the phase component of FIG. 5a.

FIG. 5d illustrates a fourth basis vector for the phase component of FIG. 5a.

FIG. 5e illustrates a fifth basis vector for the phase component of FIG. 5a.

DETAILED DESCRIPTION

A method and apparatus for encoding the phase component of a digital filter are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
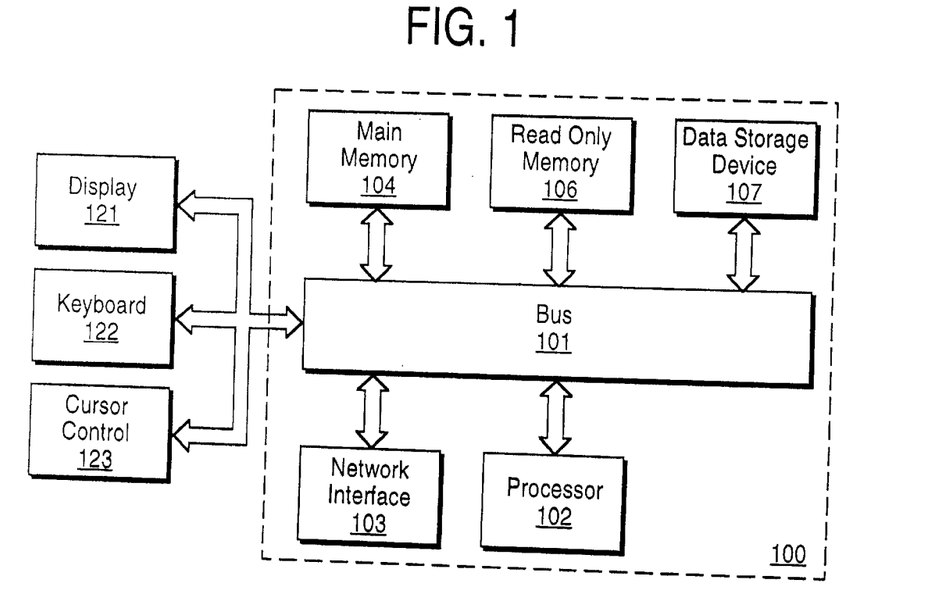
FIG. 1 illustrates a computer system in which the present invention may be implemented.

Referring to FIG. 1, a computer system upon which an embodiment of the present invention may be implemented is shown as 100. Computer system 100 comprises a bus or other communication device 101 that communicates information, and a processor 102 coupled with a bus 101 that processes information. System 100 further comprises a random access memory (RAM) or other dynamic storage device 104 (referred to as main memory), coupled to bus 101 that stores information and instructions to be executed by processor 102. Main memory 104 also may be used for storing temporary variables or other intermediate information during execution of instructions by processor 102.

Computer system 100 also comprises a read only memory (ROM) and/or other static storage device 106 coupled to bus 101 that stores static information and instructions for processor 102. Data storage device 107 is coupled to bus 101 and stores information and instructions. A data storage device 107, such as a magnetic disk or an optical disk, and its corresponding disk drive, may be coupled to computer system 100. Network interface 103 is coupled to bus 101. Network interface 103 operates to connect computer system 100 to a network of computer systems (not shown).

Computer system 100 may also be coupled via bus 101 to a display device 121, such as a cathode ray tube (CRT), for displaying information to a computer user. An alphanumeric input device 122, including alphanumeric and other keys, is typically coupled to bus 101 for communicating information and command selections to processor 102. Another type of user input device is cursor control 123, such as a mask, a track ball or cursor direction keys for communicating direction information and command selections to processor 102 and for controlling cursor movement on display 121. This input device typically has two degrees of freedom and two accesses, a first access (e.g., X) and a second access (e.g., Y), which allows the device to specify positions in a plane.

Alternatively, other input devices such as a stylus or pen can be used to interact with the display. A displayed object on a computer screen can be selected by using a stylus or a pen to touch the displayed object. The computer detects a selection by implementing a touch sensitive screen. Such a system may also lack a keyboard such as 122 wherein all interfaces provided via the stylus as a writing instrument (like a pen) and the written text is interpreted using optical character recognition (OCR) techniques.

The present invention is related to the use of a computer system, in one embodiment, for encoding a phase component of a digital filter. According to one embodiment, the computer system 100 is used as part of a method for constructing a digital filter from a set of data. The method comprises following the steps. A plurality of magnitude components of the set of data is encoded. A plurality of phase components of the set of data is encoded. The encoded magnitude components and encoded phase components are stored in a memory (e.g., main memory 104). The digital filter is constructed using the encoded magnitude components and the encoded phase components from the memory. In alternative embodiments, hard-wired circuitry may be used in place of or in combination with software instructions to implement the present invention. Thus, the present invention is not limited to any specific combination of hardware circuitry and software.

Figure 2:
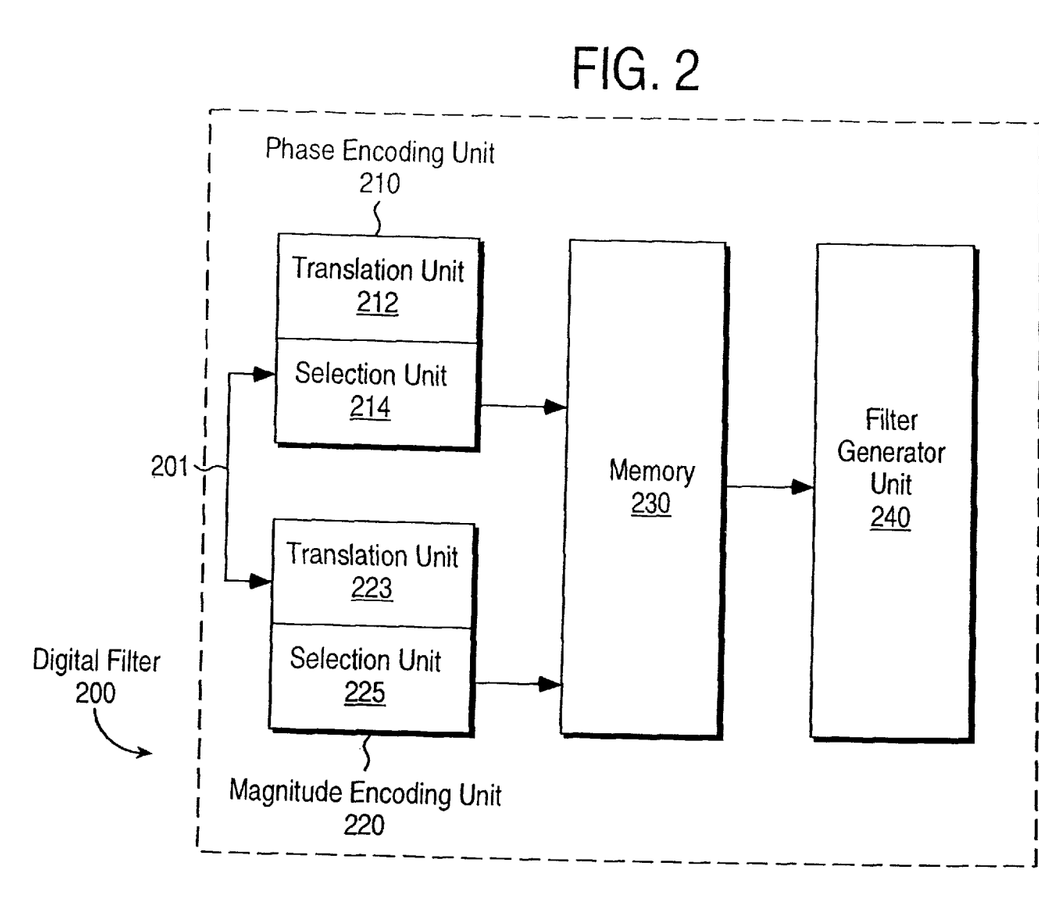
FIG. 2 illustrates a hardware embodiment of a digital filter that may be used in the present invention.

A hardware embodiment of the present invention is illustrated in FIG. 2. A digital filter 200 is represented in block diagram form. The digital filter comprises a phase encoding unit 210 and a magnitude encoding unit 220, both of which are coupled to a memory 230. The memory 230 is coupled to a filter generation unit 240 for constructing a digital filter using the encoded magnitude components and the encoded phase components from a table stored in memory 230. It is to be appreciated that the encoded magnitude components and the encoded phase components may be stored in a format other than a table.

A signal may enter at 201 and then be divided into a phase component that is sent to the phase encoding unit 210 and a magnitude component that is sent to the magnitude encoding unit 220. The phase encoding unit 210 encodes the phase component and is comprised of a translation unit 212 and a selection unit 214. The translation unit 212 translates a plurality of phase components to a set of basis vectors and corresponding weights as illustrated in FIGS. 5a–e. The selection unit 214 selects a subset of the set of basis vectors and corresponding weights using, in one embodiment, Principal Component Analysis (PCA). It will be apparent to one of ordinary skill in the art that another algorithm may also be used to select a predetermined percentage or value for data reduction.

Principal Components Analysis (or PCA) is a statistical procedure that attempts to provide an efficient representation of a set of correlated data or points. PCA is used to reduce the dimensionality of a data set in which there are a large number of interrelated measures, while keeping as much of the variation (as possible) present in the data. PCA utilizes the fact that, as a general rule, there are n-vectors in a n-dimensional space when reducing the dimensionality of a data set. For example, Principal Components Analysis (PCA) utilizes this principle and rotates the axes of the 256 dimensional space until it finds a single basis vector along which variance is at a minimum. PCA then finds an orthogonal vector along which the residual variance is at a maximum. This process continues until the 256 orthogonal basis vectors (of the 256 dimensional space) account for all of the variance in the set of data. However, instead of using 256 numbers to represent the magnitude (or phase) component of a filter, PCA allows one to use and/or store a reduced number of data (e.g., 8–10 numbers per magnitude (or phase component) per digital filter). Thus, less storage is required in memory and the perceptible sound quality is not compromised.

Under PCA, a small set of basis vectors is derived for the phase component (e.g., as illustrated in FIGS. 5a–e) and the magnitude component (not shown). These basis vectors are then used to compute the principal components for the magnitude component and the phase component, respectively. An example of a synthesized phase component using the first five basis vectors of a phase component is illustrated in curve 509 of FIG. 5f. The principal components are the sets of weights that reflect the relative contributions of each basis vector to the original data. The basis vectors are derived in such a way that the first basis vector and its weights usually capture the majority of the common variation present in the data and that the remaining vectors and weights reflect decreasing common variation and increasing unique variation. Thus, only the earlier and more significant basis vectors may be used to construct a close approximation of the original phase or magnitude component. The less significant basis vectors may be discarded. See, e.g., D. J. Kistler and F. L. Wightman, "A model of head-related transfer functions based on principal components analysis and minimum-phase construction", J. Acoust. Soc. Am. 91 (3), March 1992 for further detail.

Referring still to FIG. 2, the magnitude encoding unit 220 is also comprised of a translation unit 223 and a selection unit 225, both of which function in a manner similar to its respective counterpart in the phase encoding unit 210. After PCA is performed on the phase component and the magnitude component, the results are stored in memory 230. The filter generation unit 240 utilizes, for example, five or ten, of the basis vectors stored in memory to synthesize a close approximation of the original phase component (as illustrated in FIGS. 5f–g, respectively) and of the original magnitude component (not shown). The synthesized magnitude and phase components are then combined to create a close facsimile of the original digital filter. It is to be appreciated that these functions may also be performed by the computer system of FIG. 1. For example, the functions of the phase encoding unit, the magnitude encoding unit and the filter generation unit may be performed by the processor 302 of FIG. 1.

Figure 3:
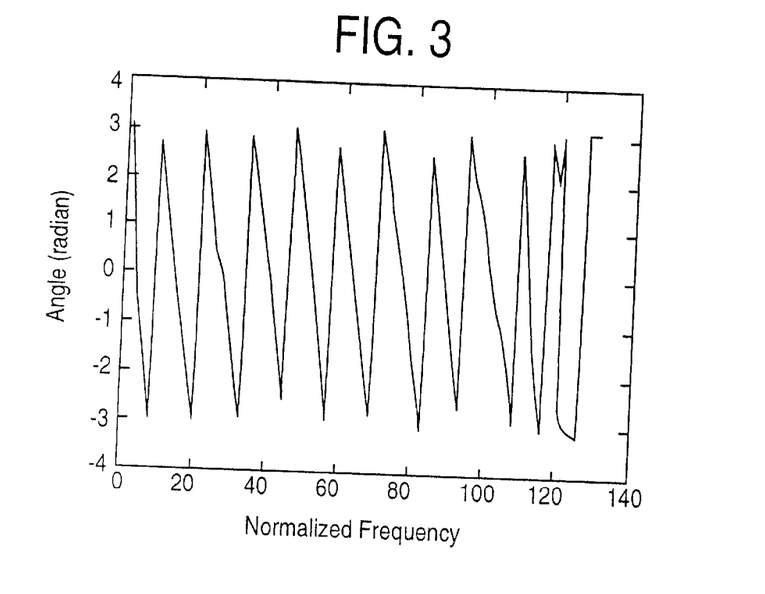
FIG. 3 illustrates a natural phase response at a particular azimuth and elevation.
Figure 4:
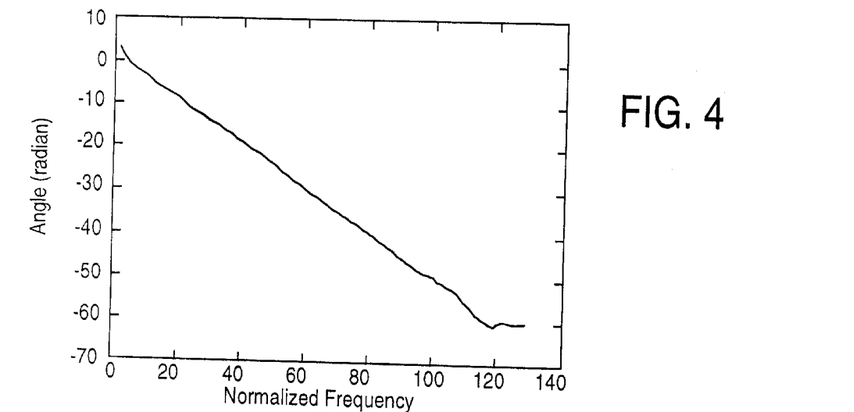
FIG. 4 illustrates the natural phase response of FIG. 3 after it has been unwrapped.

An example of a natural (or original) HRTF (Head-Related Transfer Function) phase response at an azimuth of 30° and an elevation of 30° is illustrated in FIG. 3. The natural phase response modulates between $-\pi$ (~-3.14) and $\pi$ (~3.14) radians on the Y-axis. A normalized frequency is represented on the X-axis such that each value is equal to that value multiplied by approximately 170 Hz (Hertz). The same conversion factor for normalized frequency is also applicable to FIGS. 4, 5a and 5b. In order to facilitate the use of PCA, the natural phase response is unwrapped as illustrated in FIG. 4. According to one embodiment, the log magnitude is taken, then the phase responses are each unwrapped before applying PCA to the magnitude component and to the phase component.

Figure 5A:
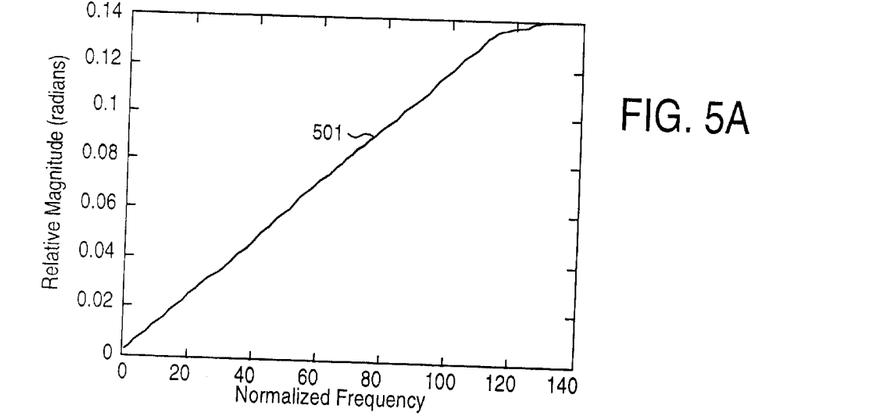
FIG. 5a illustrates a first basis vector for a phase component in the frequency domain.
Figure 5B:
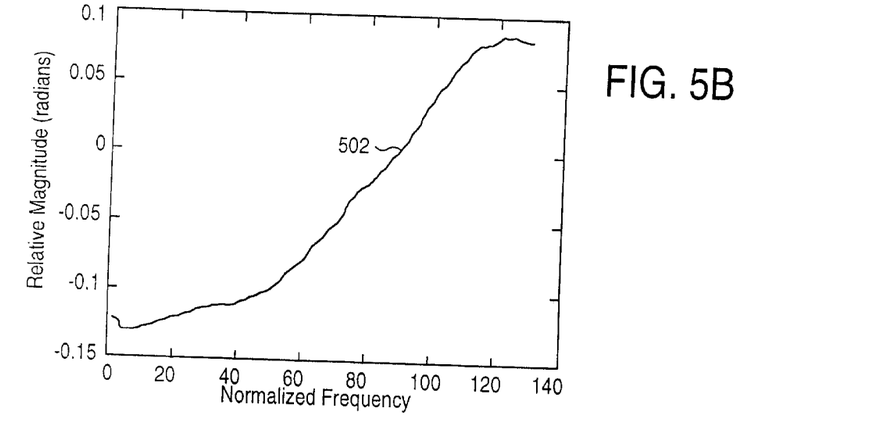
Figure 5C:
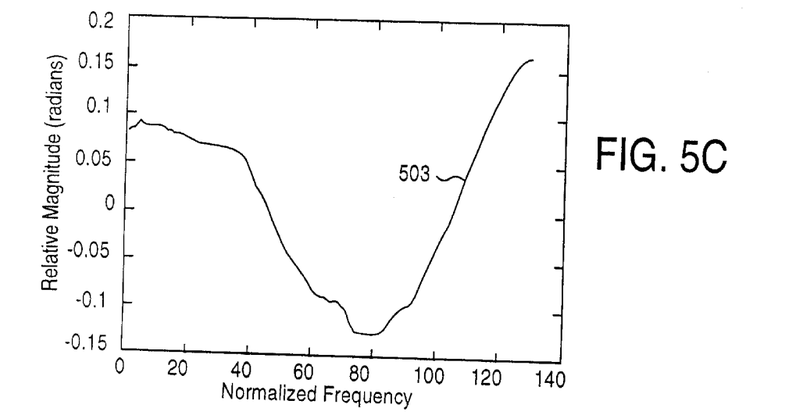
Figure 5D:
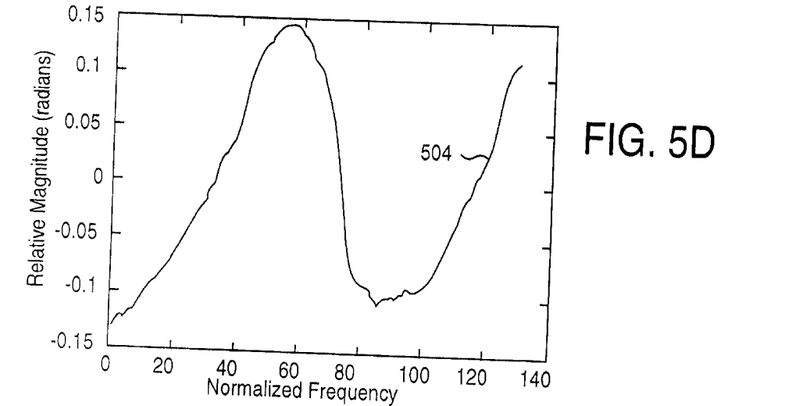
Figure 5E:
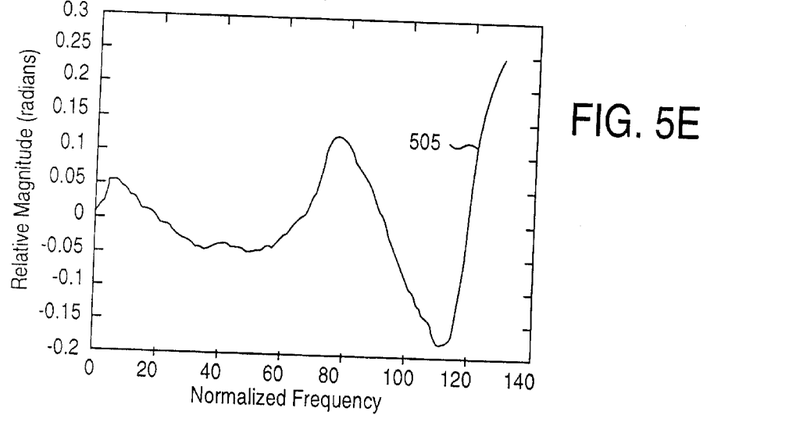
Figure 5F:
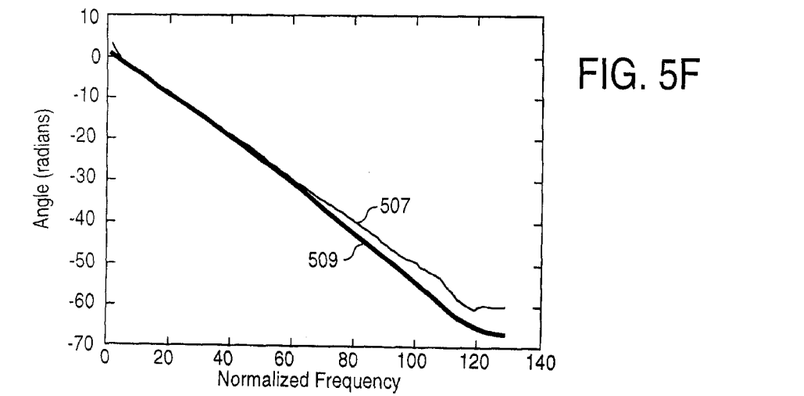
FIG. 5f illustrates a synthesized phase component using five basis vectors.
Figure 5G:
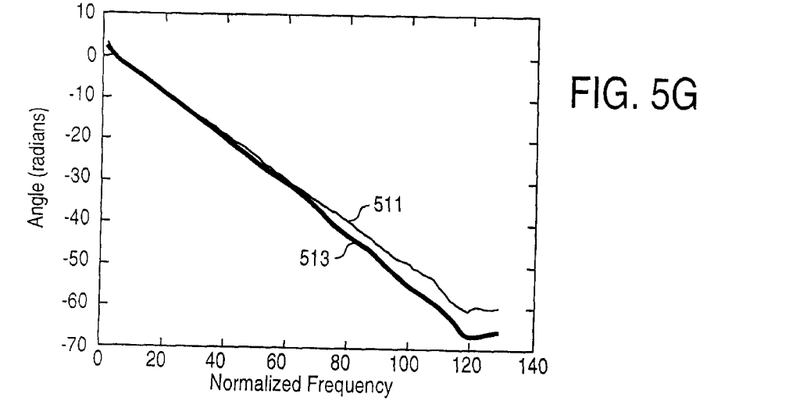
FIG. 5g illustrates a synthesized phase component using ten basis vectors.

The first basis vector 501 extracted from a PCA on a phase component is illustrated in FIG. 5a. The first basis vector 501 of the phase component is often the most weighted (or significant) vector. The second phase basis vector 502 is less weighted than the first basis vector 501 so vector 502 has a smaller range of relative magnitude (radians) as shown in FIG. 5b. This pattern is reflected with the third basis vector 503, the fourth basis vector 504 and the fifth basis vector 505 as depicted in FIGS. 5c, 5d and 5e, respectively.

Figure 5H:
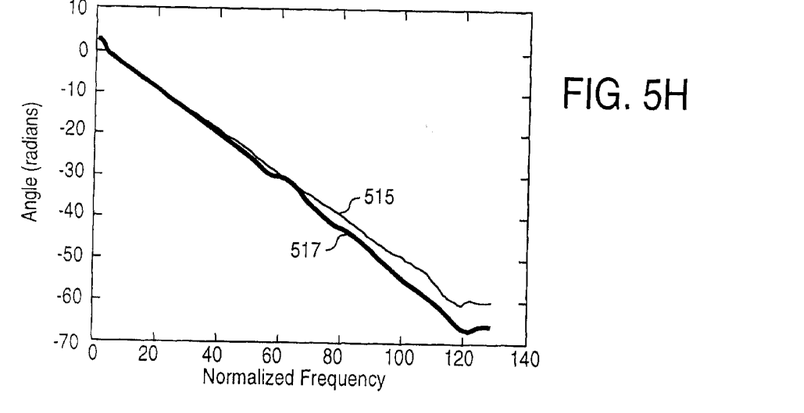
FIG. 5h illustrates a synthesized phase component using thirty basis vectors.

Referring to FIGS. 5f–h, three graphs of the phase component over frequency utilizing a varying number of different basis vectors are illustrated. The original phase response (507, 511, 515) is compared with its respective synthesized phase response (509, 513, 517) using five, then ten and thirty basis vectors, respectively. At the lower normalized frequency values (e.g., 10–20) there is a greater overlap between the original phase response and the synthesized phase response for FIGS. 5f–h. As expected, the synthesized phase response 517 of FIG. 5h which used thirty basis vectors has less perceptible distortions at low frequencies than the synthesized phase response 509 of FIG. 5f which used five basis vectors. In addition, the graphs of FIGS. 5f–h show that all of the synthesized phase responses (509, 513 and 517) deviated more from the original phase response (507, 511 and 515), respectively, at higher normalized frequencies (e.g., 100–120). But phase distortion at high frequencies are difficult to detect or perceive.

Figure 6:
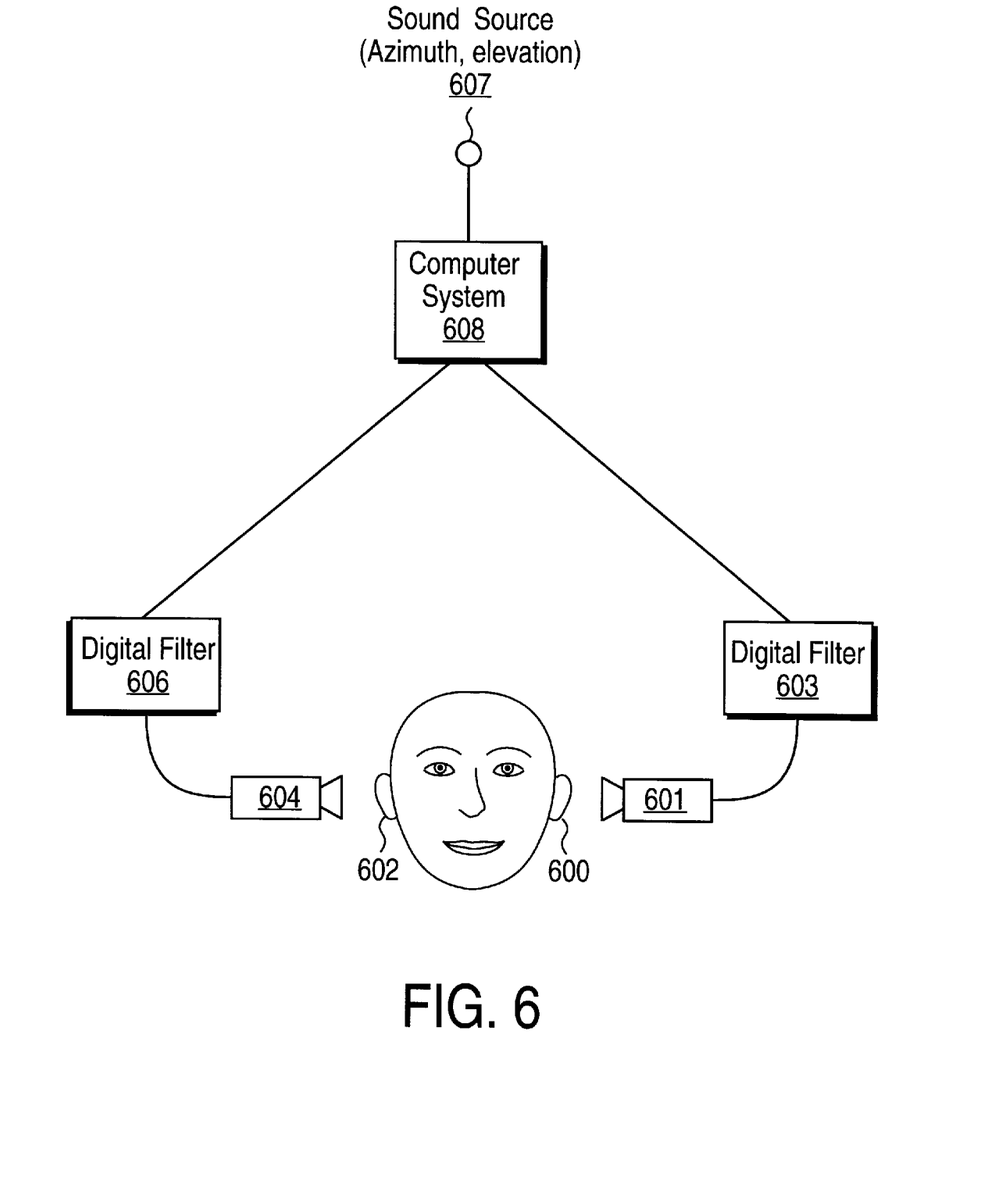
FIG. 6 illustrates the invention being used to synthesize a head related transfer function.

FIG. 6 illustrates one embodiment of the present invention and its implementation in audio digital signal processing. The first step in implementing this embodiment is to take the measurements of an actual subject as illustrated in FIG. 6. A subject sits in an echo-proof chamber with a microphone (not shown) attached to the right ear 600 and another microphone (not shown) attached to the left ear 602. The right microphone and the left microphone are each coupled to a sound source 607. The microphones measure how the sound is perceived by each respective ear of the subject. A computer system 608 records the results and then creates each of the digital filters 603 and 606 using the measurements taken at the listener's eardrum. Collectively, these measurements are referred to as HRTFs (Head-Related Transfer Functions). These measurements show how the sound is changed before the sound reaches the ear.

Referring still to FIG. 6, which illustrates the synthesis of a head-related transfer function, a computer system 608 is coupled to a sound source 607. A sound source 607 (e.g., a speaker) at a selected azimuth and elevation is selected. The direction of a sound source on the horizontal plane (e.g., at ear level) is measured by its azimuth angle. The direction of a sound source on a vertical plane (e.g., above or below ear level) is measured by its elevation angle. Speakers 601 and 604 are coupled to the right ear 600 and the left ear 602, respectively. An input sound 607 is filtered by a matched pair of HRTF digital filters 603 and 606 to simulate the spatial location of the sound. In one embodiment, digital filters 603 and 606 are finite impulse response (FIR) filters. The spatialized sound, when presented to the listener through speakers 601 and 604, enhances the virtual reality experience.

According to one embodiment, a sound source is selected for every ten degrees of change in azimuth and elevation which results in approximately 614 different positions in space. Thus, 614 filters are used to represent the 614 different sound sources in space. It is to be appreciated that the number of filters used will vary depending on the number of positions to be measured for sound. Each audio signal from a virtual sound source 607 will be processed by digital filter 606 and digital filter 603 before the virtual sound reaches its respective ear. According to one aspect of the present invention, the digital filter is used to model head related transfer functions.

Head-related transfer functions are the summation of all the external effects that occur to a sound signal from the time it leaves a sound source until it reaches the subject's eardrum. For example, one component of the transfer function may represent how a sound bounces off a subject's shoulder. Another component of a transfer function may represent how a sound source located to the right of a subject will reach the subject's right ear before it reaches the subject's left ear. In addition, another example of a component is how the sound is delayed as the sound moves through space. But instead of modeling all these effects independently, the digital filter of the present invention, in one embodiment, models all these changes together in one transfer function known as a head related-transfer function (HRTF). It is to be appreciated that the present invention may be used to model other transfer functions.

Figure 7:
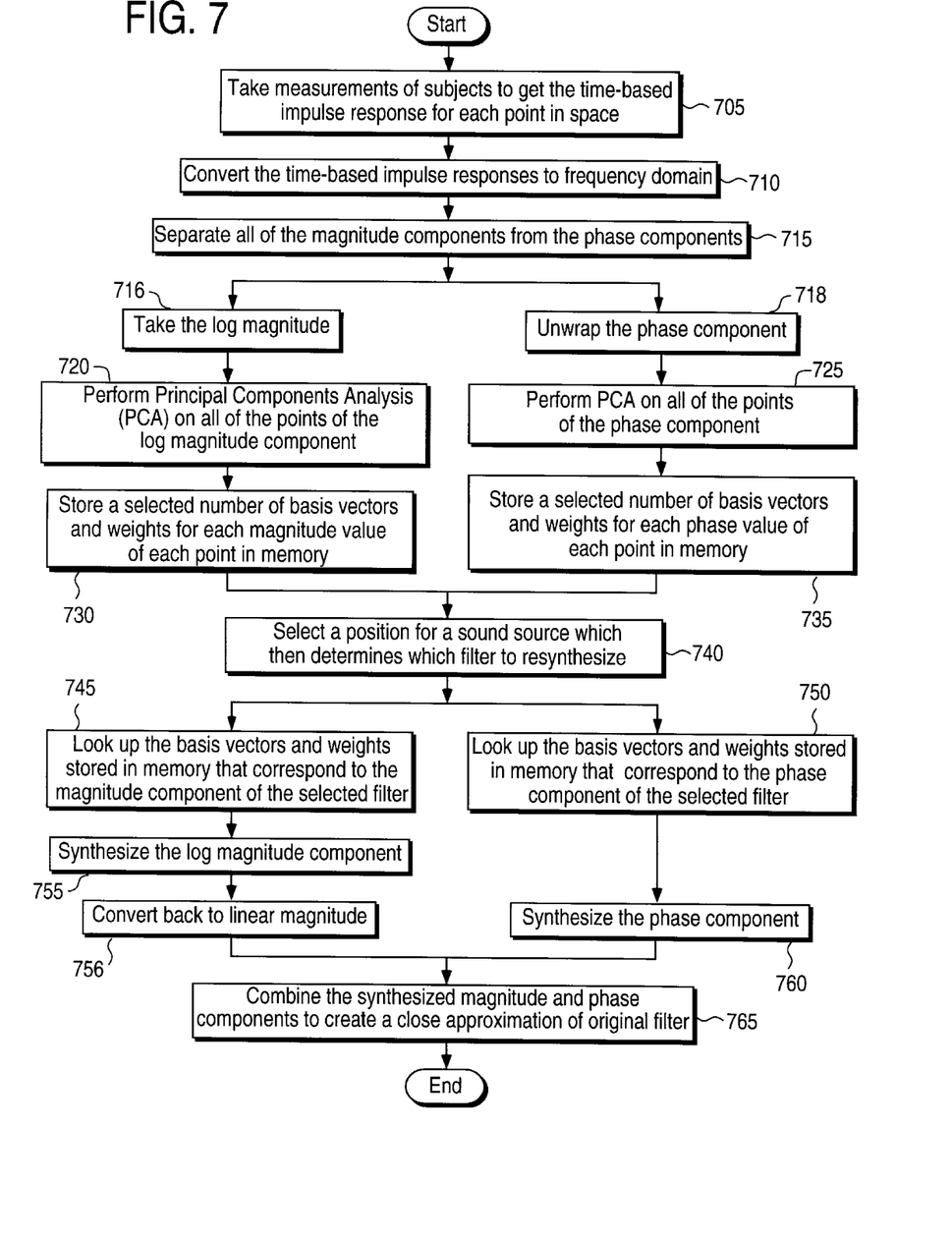
FIG. 7 is a flow chart illustrating the method of the present invention.

FIG. 7 is a flow chart of one embodiment which is illustrated in FIG. 6. In step 705, a computer system is used to take measurements of a subject (or subjects) in order to obtain a time based impulse response for each point in space. Each point represents a location in space of a sound source. In addition, each point can be represented by a magnitude component and a phase component of a transfer function.

In order to make the calculations easier, the time-based impulse responses for each of the points are converted to a frequency-based domain in step 710. In one embodiment, Fast Fourier Transforms are used to convert the time-based impulse responses to frequency-based impulse responses.

In step 715, all of the magnitude components are separated from the phase components of the digital filter.

In step 716, the phase component is unwrapped as illustrated in FIG. 4.

In parallel or in sequence, in step 718, the log ten of the magnitude is calculated in preparation for Principal Components Analysis (PCA).

Once the components are separated, PCA is performed on all of the points of the magnitude component in step 720.

In parallel or in sequence, PCA is then performed on all of the points of the phase component in step 725 to generate a number of basis vectors as illustrated in FIGS. 5*a–e*.

According to one embodiment, one stores a selected (or predetermined) number of basis vectors and weights for each of the magnitude values for each point in a table located in memory in step 730. The range of stored basis vectors and weights, in one embodiment, may vary from 3–4% of the measured basis vectors and weights to 50% of the collected basis vectors and weights, which represents almost all of the points. For example, if there are 256 basis vectors measured because a finite impulse response (FIR) digital filter having 256 taps (or points) is used, then PCA may reduce it to, for example, 10–12 of the most significant basis vectors and weights. Thus, only the most significant basis vectors and weights are stored in memory, which reduces the amount of memory needed.

Referring still to FIG. 7, in step 735, PCA is also utilized to store a selected number of basis vectors and weights for the phase component in a table located in memory.

If one decides to recreate a particular sound in a specific location in space, then one selects which digital filter to synthesize based on that position. This embodiment is particularly relevant for virtual reality applications of the present invention. A position in space is selected for a sound source in step 740.

In step 745, the basis vectors and weights (stored in the table) that correspond to the magnitude component of the chosen filter are selected.

A similar process is then repeated for the phase component in step 750.

In step 755, the log magnitude component of the digital filter is synthesized.

The log magnitude component is converted to linear magnitude in step 756.

In step 760, the phase component of the digital filter is also synthesized in parallel or in sequence.

Finally, in step 765, the synthesized magnitude component and phase component are combined to create a close approximation of the original digital filter as illustrated in FIGS. 5*f–h*. In one embodiment, the digital filter may represent, for example, a head-related transfer function. The digital filter may also be used to model a variety of other transfer functions.

The foregoing description provides an example of a method and an apparatus for encoding the phase component in a digital filter. It will be appreciated that numerous modifications may be made in practicing the present invention without departing from the spirit and scope of the invention, which is defined by the following claims.

What is claimed is:

1. A method for constructing a digital filter from a set of data, comprising the steps of:
   encoding a plurality of magnitude components of the set of data;
   encoding a plurality of phase components of the set of data;
   storing the plurality of encoded magnitude components and encoded phase components in a memory; and
   constructing the digital filter using the plurality of encoded magnitude components and encoded phase components from the memory.

2. The method of claim 1 further comprising the step of transforming the set of data from a time-based impulse response domain to a frequency-based impulse response domain.

3. The method of claim 2, wherein the step of transforming comprises applying Fast Fourier Transform techniques to the set of data.

4. The method of claim 1, wherein the step of encoding a plurality of magnitude components of the set of data comprises:
   calculating the log 10 of the magnitude components;
   translating the magnitude components of the set of data to a set of basis vectors and weights; and
   selecting a subset of the basis vectors and weights to represent the magnitude components of the set of data.

5. The method of claim 1, wherein the step of encoding a plurality of magnitude components of the set of data comprises applying Principal Component Analysis techniques to the set of data.

6. The method of claim 1, wherein the step of encoding a plurality of phase components of the set of data comprises:
   unwrapping the phase components;
   translating the phase components of the set of data to a set of basis vectors and weights; and
   selecting a subset of the basis vectors and weights to represent the phase components of the set of data.

7. The method of claim 1, wherein the step of encoding a plurality of phase components of the set of data comprises applying Principal Component Analysis techniques to the set of data.

8. A computer-readable medium having stored thereon sequences of instructions, the sequences of instructions including instructions which, when executed by a processor, causes the processor to perform the steps of:
   separating a magnitude component and a phase component from a set of data;
   encoding the magnitude component of the set of data;
   encoding the phase component of the set of data;
   storing the encoded magnitude component and the encoded phase component on a memory; and
   constructing a digital filter using the encoded magnitude component and the encoded phase component from the memory.

9. The computer-readable medium of claim 8 further comprising instructions which, when executed by the processor, causes the processor to perform the step of transforming the set of data from a time-based domain to a frequency-based domain.

10. The computer-readable medium of claim 9, wherein the step of transforming comprises applying Fast Fourier Transform techniques to the set of data.

11. The computer-readable medium of claim 8, wherein the step of encoding the magnitude component of the set of data comprises:
   translating the magnitude component of the set of data to a set of weighted basis vectors; and
   selecting a subset of the weighted basis vectors to represent the magnitude component of the set of data.

12. The computer-readable medium of claim 8, wherein the step of encoding the magnitude component of the set of data comprises applying Principal Component Analysis techniques to the set of data.

13. The method of claim 8, wherein the step of encoding the phase component of the set of data comprises:
   translating the phase component of the set of data to a set of weighted basis vectors; and selecting a subset of the weighted basis vectors to represent the phase component of the set of data.

14. The method of claim 8, wherein the step of encoding the phase component of the set of data comprises applying Principal Component Analysis to the set of data.

15. A digital filter, comprising:
a magnitude encoding unit that encodes a magnitude component of a set of data;
a phase encoding unit, coupled to the magnitude encoding unit, that encodes a phase component of the set of data;
a memory, coupled to the magnitude encoding unit and the phase encoding unit, that stores the encoded magnitude component and the encoded phase component; and
a filter generation unit, coupled to the memory, that constructs the digital filter using the encoded magnitude component and the encoded phase component from the memory.

16. The digital filter of claim 15, wherein the memory stores the encoded magnitude component and the encoded phase component in a table.

17. The digital filter of claim 15 further comprising a data transformation unit, coupled to the magnitude encoding unit and the phase encoding unit, for transforming the set of data from a time-based domain to a frequency-based domain.

18. The digital filter of claim 15, wherein the phase encoding unit comprises:
a translation unit that translates the phase component to a set of basis vectors and corresponding weights; and
a selection unit, coupled to the translation unit, that selects a subset of the set of basis vectors and corresponding weights.

19. The digital filter of claim 15, wherein the magnitude encoding unit comprises:
a translation unit that translates the magnitude component to a set of basis vectors and corresponding weights; and
a selection unit, coupled to the translation unit, that selects a subset of the set of basis vectors and corresponding weights.

20. A method for constructing a phase component in a digital filter, the method comprising:
encoding the phase component of a set of data;
storing the phase component in a memory; and
synthesizing the phase component of the digital filter from the memory.

21. The method of claim 20, wherein the encoding step includes:
reducing the set of data used to represent the phase component in the digital filter.

22. The method of claim 21, wherein Principal Component Analysis is used to reduce the set of data.

23. The method of claim 21, wherein the set of data used to represent the constructed phase component is reduced by an amount in a range of about 50% to about 97%.

24. An instruction set for synthesizing a phase component of a digital filter, wherein the instruction set is executed by a machine, the instruction set comprises the following steps:
unwrapping the phase component of a sound signal;
measuring a plurality of sound signals;
applying Principal Component Analysis to the phase component of the sound signal to derive a set of basis vectors and weights;
storing a subset of the set of basis vectors and weights;
retrieving the stored subset of basis vectors and weights that correspond to a selected sound signal; and
synthesizing the phase component of the digital filter.

25. The instruction set of claim 24, wherein the digital filter models a head-related transfer function.

26. A method for constructing a digital filter from a set of audio signal data, comprising the steps of:
encoding a plurality of magnitude components of the set of audio signal data;
encoding a plurality of phase components of the set of audio signal data;
storing the plurality of encoded magnitude components and encoded phase components in a memory; and
constructing the digital filter using the plurality of encoded magnitude components and encoded phase components from the memory.

27. The method of claim 26 further comprising the step of transforming the set of audio signal data from a time-based impulse response domain to a frequency-based impulse response domain.

28. The method of claim 27, wherein the step of transforming comprises applying Fast Fourier Transform techniques to the set of audio signal data.

29. The method of claim 26, wherein the step of encoding a plurality of magnitude components of the set of audio signal data comprises:
calculating the log 10 of the magnitude components;
translating the magnitude components of the set of audio signal data to a set of basis vectors and weights; and
selecting a subset of the basis vectors and weights to represent the magnitude components of the set of audio signal data.

30. The method of claim 26, wherein the step of encoding a plurality of magnitude components of the set of audio signal data comprises applying Principal Component Analysis techniques to the set of audio signal data.

31. The method of claim 26, wherein the step of encoding a plurality of phase components of the set of audio signal data comprises:
unwrapping the phase components;
translating the phase components of the set of audio signal data to a set of basis vectors and weights; and
selecting a subset of the basis vectors and weights to represent the phase components of the set of audio signal data.

32. The method of claim 26, wherein the step of encoding a plurality of phase components of the set of audio signal data comprises applying Principal Component Analysis techniques to the set of audio signal data.

33. A computer-readable medium having stored thereon sequences of instructions, the sequences of instructions including instructions which, when executed by a processor, causes the processor to perform the steps of:
separating a magnitude component and a phase component from a set of audio signal data;
encoding the magnitude component of the set of audio signal data;
encoding the phase component of the set of audio signal data;
storing the encoded magnitude component and the encoded phase component on a memory; and
constructing a digital filter using the encoded magnitude component and the encoded phase component from the memory.

34. The computer-readable medium of claim 33 further comprising instructions which, when executed by the processor, causes the processor to perform the step of transforming the set of audio signal data from a time-based domain to a frequency-based domain.

35. The computer-readable medium of claim 34, wherein the step of transforming comprises applying Fast Fourier Transform techniques to the set of audio signal data.

36. The computer-readable medium of claim 33, wherein the step of encoding the magnitude component of the set of audio signal data comprises:

translating the magnitude component of the set of audio signal data to a set of weighted basis vectors; and selecting a subset of the weighted basis vectors to represent the magnitude component of the set of audio signal data.

37. The computer-readable medium of claim 33, wherein the step of encoding the magnitude component of the set of audio signal data comprises applying Principal Component Analysis techniques to the set of audio signal data.

38. The method of claim 33, wherein the step of encoding the phase component of the set of audio signal data comprises:

translating the phase component of the set of audio signal data to a set of weighted basis vectors; and selecting a subset of the weighted basis vectors to represent the phase component of the set of audio signal data.

39. The method of claim 33, wherein the step of encoding the phase component of the set of audio signal data comprises applying Principal Component Analysis to the set of audio signal data.

40. A digital filter, comprising:

a magnitude encoding unit that encodes a magnitude component of a set of audio signal data;

a phase encoding unit, coupled to the magnitude encoding unit, that encodes a phase component of the set of audio signal data;

a memory, coupled to the magnitude encoding unit and the phase encoding unit, that stores the encoded magnitude component and the encoded phase component; and a filter generation unit, coupled to the memory, that constructs the digital filter using the encoded magnitude component and the encoded phase component from the memory.

41. The digital filter of claim 40, wherein the memory stores the encoded magnitude component and the encoded phase component in a table.

42. The digital filter of claim 40 further comprising a audio signal data transformation unit, coupled to the magnitude encoding unit and the phase encoding unit, for transforming the set of audio signal data from a time-based domain to a frequency-based domain.

43. The digital filter of claim 40, wherein the phase encoding unit comprises:

a translation unit that translates the phase component to a set of basis vectors and corresponding weights; and a selection unit, coupled to the translation unit, that selects a subset of the set of basis vectors and corresponding weights.

44. The digital filter of claim 40, wherein the magnitude encoding unit comprises:

a translation unit that translates the magnitude component to a set of basis vectors and corresponding weights; and a selection unit, coupled to the translation unit, that selects a subset of the set of basis vectors and corresponding weights.

45. A method for constructing a phase component in a digital filter, the method comprising:

encoding the phase component of a set of audio signal data;

storing the phase component in a memory; and synthesizing the phase component of the digital filter from the memory.

46. The method of claim 45, wherein the encoding step includes:

reducing the set of audio signal data used to represent the phase component in the digital filter.

47. The method of claim 46, wherein Principal Component Analysis is used to reduce the set of audio signal data.

48. The method of claim 46, wherein the set of audio signal data used to represent the constructed phase component is reduced by an amount in a range of about 50% to about 97%.

* * * * *